United States Patent [19]

Kadosh et al.

[11] Patent Number: 5,731,217

[45] Date of Patent: Mar. 24, 1998

[54] MULTI-LEVEL TRANSISTOR FABRICATION METHOD WITH A FILLED UPPER TRANSISTOR SUBSTRATE AND INTERCONNECTION THERETO

[75] Inventors: Daniel Kadosh, Austin; Mark I. Garnder, Cedar Creek; Tom E. Spikes, Round Rock, all of Tex.

[73] Assignee: Advanced Micro Devices, Inc., Sunnyvale, Calif.

[21] Appl. No.: 727,741

[22] Filed: Oct. 8, 1996

[51] Int. Cl.⁶ ............................................. H01L 21/265
[52] U.S. Cl. ........................ 437/41; 437/57; 437/915
[58] Field of Search ................................. 437/40, 41, 44, 437/48, 52, 60, 915, 57

[56] References Cited

U.S. PATENT DOCUMENTS

| | | | |
|---|---|---|---|
| 4,381,201 | 4/1983 | Sakurai | 437/915 |
| 4,489,478 | 12/1984 | Sakurai | 437/915 |
| 4,902,637 | 2/1990 | Kondou et al. | 437/915 |
| 5,122,476 | 6/1992 | Fazan et al. | 437/52 |
| 5,266,511 | 11/1993 | Takao | 437/915 |
| 5,352,623 | 10/1994 | Kamiyama | 437/52 |
| 5,418,177 | 5/1995 | Choi | 437/60 |
| 5,424,235 | 6/1995 | Nishihara | 437/60 |
| 5,470,776 | 11/1995 | Ryou | 437/52 |
| 5,476,807 | 12/1995 | Lee et al. | 437/52 |

*Primary Examiner*—John Niebling
*Assistant Examiner*—Michael S. Lebentritt
*Attorney, Agent, or Firm*—Kevin L. Daffer; Conley, Rose & Tayon

[57] ABSTRACT

A process is provided for producing active and passive devices on various levels of a semiconductor topography. As such, the present process can achieve device formation in three dimensions to enhance the overall density at which an integrated circuit is formed. The multi-level fabrication process not only adds to the overall circuit density but does so with emphasis placed on interconnection between devices on separate levels. Thus, high performance interconnect is introduced whereby the interconnect is made as short as possible between features within one transistor level to features within another transistor level. The interconnect employs a via routed directly between a substrate of an upper level transistor to a substrate of a lower transistor so as to effect direct coupling between the channels of the respective transistors. Direct coupling in this fashion affords consistent operation of transistors arranged on separate elevation levels. The via is made as short as possible so as to reduce any discrepancy in substrate/well voltage potential. This ensures predictable operation of transistors fashioned on separate elevation levels.

19 Claims, 3 Drawing Sheets

MULTI-LEVEL TRANSISTOR FABRICATION METHOD WITH A FILLED UPPER TRANSISTOR SUBSTRATE AND INTERCONNECTION THERETO

BACKGROUND OF THE INVENTION

1. Field of the Invention

This invention relates to integrated circuit manufacture and more particularly to multi-level transistor fabrication and high performance interconnect arranged therebetween.

2. Description of the Relevant Art

The structure and the various components, or features, of a metal oxide semiconductor ("MOS") are generally well known. A MOS transistor typically comprises a substrate material onto which a patterned gate conductor is formed. The gate conductor serves to self-align impurities forwarded into the substrate on opposite sides of the gate conductor. The impurities placed into the substrate define a junction region, also known as source/drain regions. The gate conductor is patterned from a layer of polysilicon using various lithography techniques.

A typical n-channel MOS transistor employs n-type junctions placed into a p-type substrate. Conversely, a typical p-channel MOS transistor comprises p-type junctions placed into an n-type substrate. The substrate can extend entirely across a monolithic silicon wafer or can be classified as a "well" which extends only across a portion of the wafer. Thus, the term substrate is used liberally henceforth and is defined to include either the entire wafer area or only a portion of the wafer, to interchangeably encompass the term well. The substrate (or well) is doped with an impurity type opposite the junction areas.

A pervasive trend in modern integrated circuit manufacture is to produce transistors having feature sizes as small as possible. To achieve a high density integrated circuit, features such as the gate conductor, source/drain junctions, and interconnect to the junctions must be as small as possible. Many modern day processes employ features which have less than 1.0 μm critical dimension. As feature size decreases, the resulting transistor as well as the interconnect between transistors also decreases. Smaller transistors allows more transistors to be placed on a single monolithic substrate, thereby allowing relatively large circuit systems to be incorporated on a single, relatively small die area.

The benefits of high density circuits can only be realized if advanced processing techniques are used. For example, semiconductor process engineers and researchers often study the benefits of electron beam lithography and x-ray lithography to achieve the lower resolutions needed for submicron features. To some extent wet etch has given way to a more advanced anisotropic (dry etch) technique. Further, silicides and polycides have replaced higher resistivity contact structures mostly due to the lower resistivity needed when a smaller contact area is encountered.

There are many numerous other techniques used to achieve a higher density circuit, however, these techniques as well as others still must contend with problems resulting from higher density itself. Even the most advanced processing techniques cannot in all instances offset the problems associated with small features or features arranged extremely close to one another. For example, as the channel length decreases, short channel effects ("SCE") generally occur. SCE cause threshold voltage skews at the channel edges as well as excessive subthreshold currents (e.g., punch through and drain-induced barrier lowering). Related to SCE is the problem of hot carrier injection ("HCI"). As the channel shortens and the supply voltage remains constant, the electric field across the drain-to-channel junction becomes excessive. Excessive electric field can give rise to so called hot carriers and the injection of those carriers into the gate oxide which resides between the substrate (or well) and the overlying gate conductor. Injection of hot carriers should be avoided since those carriers can become trapped and skew the turn-on voltage of the ensuing transistor.

It appears as though even the most advanced processing techniques cannot avoid in all instances the problems which arise as a result of high density fabrication. As features are shrunk and are drawn closer together across a single topological surface, the closeness of those features causes numerous problems even under the most advanced processing conditions. It therefore appears that there may be a certain limitation beyond which feature sizes cannot be reduced if those features are to reside on the single elevational level. It would therefor be desirable to derive a processing technique which can produce features on more than one level. That is, it would be beneficial that this multi-level processing technique produce both active (transistors) and passive (capacitors and resistors) in three dimensions so as to enhance the overall circuit density without incurring harmful side effects associated with feature shrinkage and closeness.

In order to form a transistor on separate elevation levels, careful attention must be paid to the interconnection between transistors placed on those levels. Therefore, it is desirable to derive an interconnect scheme which can connect one or more features on one elevation (topological) level to one or more features on another level. That interconnection must be made as short as possible in order to avoid voltage discrepancies between the features being connected. Of particular importance is the need to minimize voltage differential as seen by the channel region of a lower level transistor and the channel region of an upper level transistor. It is therefore imperative that a low resistance contact be made between transistor channels on separate elevation levels. A process which forms a multi-level transistor must therefore produce, during the process sequence, low resistance interconnect between channel regions arranged on separate elevation levels for the purpose of maintaining consistence operation among those transistors. If resistance between wells is too high, then one transistor may turn on or off prematurely relative to the other—an outcome which should be avoided if high performance circuit operation is desired.

SUMMARY OF THE INVENTION

The problems outlined above are in large part solved by a multi-level transistor fabrication technique. The present technique can produce one or more active and passive devices on a first level, followed by one or more active and passive devices on a second level. The first level is substantially planar and extends across an entire wafer surface. The second level is also substantially planar and parallel to the first level, but spaced by a dielectric therefrom.

An active device formed on the first level is termed a first level transistor, or more simply a first transistor. Similarly, an active device formed on the second level is termed a second level transistor, or second transistor. The first transistor is formed within and upon a first level substrate. A second level substrate which accommodates the second transistor is spaced above the first level substrate by an interlevel dielectric. According to one embodiment, the first level substrate comprises a similarly doped implant area. This implant area is termed a well-connect implant. Being doped the same as but with higher concentration than the first level substrate, the well-connect implant is electrically connected with the first level substrate. The second level substrate comprises a region of polysilicon material into which and upon which the second transistor is formed. The second level substrate is doped with an impurity of the same type as that used in the first level substrate and the well-connect implant. The well-connect implant is spaced a lateral distance from the first transistor within the first level substrate. The first level substrate which encompasses the first transistor junctions and the well-connect implant may interchangeably be called a well. It is recognized that the second level substrate can also be interchangeably called a well. Regardless of the nomenclature use, a substrate (or well) defined herein is one having a well-connect implant at the first topological level and a polysilicon-based material at the second topological level.

The second transistor is spaced directly above the well-connect implant. Specifically, the second level substrate of the second transistor is spaced directly above the well-connect implant. A via extends along a vertical axis directly between the second level substrate and the well-connect implant. Accordingly, the via is conductive and made as short as possible so as to minimize voltage discrepancy between the first and second level substrates (i.e., between the first and second transistor channels).

As a result of the direct path taken by the conductive via, low resistance and therefore minimum voltage disparity exits between upper and lower substrate/well regions. Direct via routing is achieved by aligning the second transistor a spaced distance above yet laterally offset from the first transistor. The conductive via is of predefined width and extends from the bottom surface of the second transistor substrate along an axis defined as perpendicular to the planes in which the first and second level transistors are placed. That axis is preferably vertical and relatively short as defined by the thickness of the interlevel dielectric which separates those planes.

Broadly speaking, the present invention contemplates a method for interconnecting a well region of a first transistor to a well region of a second transistor. The well region of the first transistor is defined within the first level substrate, and the well region of the second transistor is defined within the second level substrate. A process is therefore presented for forming connection between the first transistor substrate and the second transistor substrate. Thus, the first transistor substrate encompasses a well-connect implant, a source region and a drain region. The source and drain regions are spaced from one another about a channel region of the first transistor. A first dielectric (i.e., first interlevel dielectric) is deposited across the first transistor as well as the topography lateral to the first transistor. An opening is then etched through the first dielectric to the well-connect implant. The opening is then filled with a metal, and a second dielectric is deposited upon the first dielectric and metal upper surfaces. The second dielectric is then removed in a region above the metal to form a trench. The trench is then filled with a polysilicon material such that the bottom surface of polysilicon contacts the metal. Dopants are then deposited within the polysilicon to render the polysilicon conductive and thereafter films and other dopants are deposited upon and within, respectively, the polysilicon to form the second transistor.

The present invention further contemplates an integrated circuit. The integrated circuit comprises an interconnect routed between the well-connect implant of the first transistor and the second transistor substrate. The interconnect comprises a conductive via extending along a vertical axis between opposed upper and lower via portions. A lowermost surface of the lower portion is configured to abut against the well-connect implant of the first transistor. An uppermost surface of the upper portion is configured to abut against a second level substrate which resides above the first transistor. The second transistor is configured entirely within the second level substrate.

Preferably, the substrate into which the well-connect implant and source/drain implants of the first transistor are formed comprises a silicon-based material. The silicon-based material is coated with an oxide of relatively uniform thickness. The oxide thereby serves as a gate oxide for the first transistor. Similarly, a uniform thickness oxide is formed upon the polysilicon which forms the second transistor well. That oxide serves as a gate oxide for the second transistor. The metal used to fill the opening to form the interconnect via between the second transistor substrate and the first transistor substrate is either titanium, tungsten, titanium nitride or aluminum (i.e., Ti, W, TiN or Al), or any combination of these metals.

BRIEF DESCRIPTION OF THE DRAWINGS

Other objects and advantages of the invention will become apparent upon reading the following detailed description and upon reference to the accompanying drawings in which.

Figure 1:
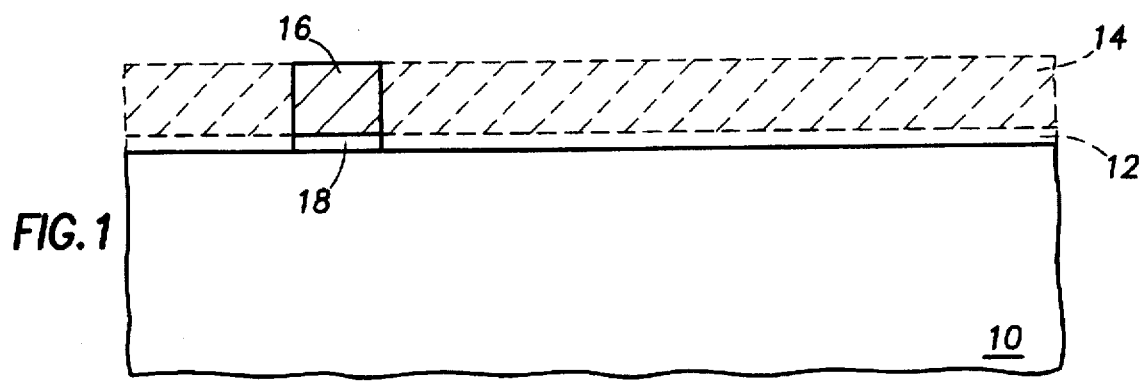
FIG. 1 is a partial cross-sectional view of a semiconductor substrate having a gate conductor patterned upon the substrate according to an initial processing step of the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Turning now to the drawings, FIG. 1 illustrates a partial cross-sectional view of a semiconductor substrate 10. Substrate 10 is preferably a silicon-based, single crystalline material doped either n-type or p-type. Arranged on the upper surface of substrate 10 are various isolation structures (not shown). Isolation structures can be formed either by a shallow-trench process or the well known LOCOS process. The isolation structures serve to isolate active devices placed within and upon substrate 10.

Formed across the entire substrate 10 is a dielectric 12. Dielectric 12 is often referred to as a gate dielectric. Dielectric 12 can be formed by growing an oxide upon the silicon-based substrate 10, or by depositing an oxide which, according to one embodiment, can contain nitrogen species. Deposited upon dielectric 12 is a layer of polycrystalline silicon ("polysilicon"). Select regions of polysilicon 14 and dielectric 12 are removed using conventional lithography: pattern, develop and etch cycles. The retained region is defined as an active region or, more specifically, the region in which a gate conductor 16 and gate dielectric 18 are formed. Gate conductor 16 and gate dielectric 18 are thereby the retained portions of polysilicon 14 and dielectric 12, respectively.

Figure 2:
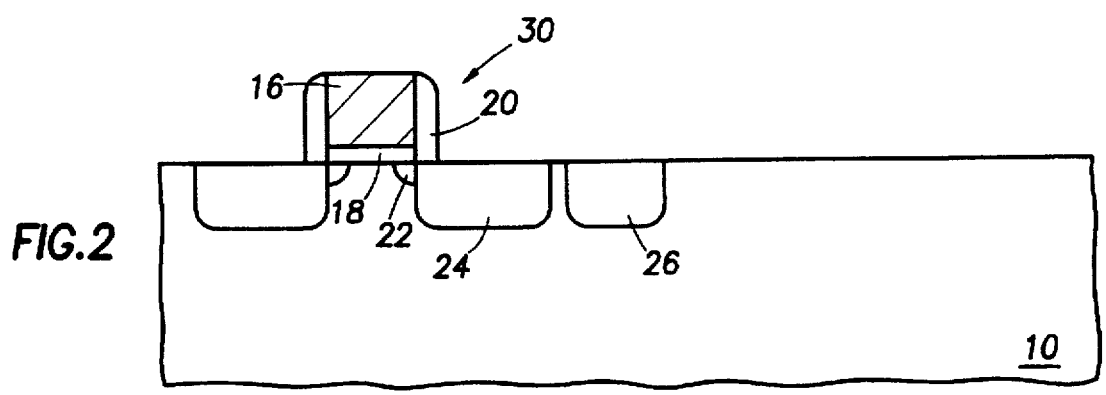
FIG. 2 is a partial cross-sectional view of the semiconductor substrate having implant regions placed within the substrate to form a first transistor with a well-connect implant spaced from the transistor according to a processing step subsequent to FIG. 1.

FIG. 2 illustrates a processing step subsequent to FIG. 1 whereby dielectric spacers 20 are formed on the opposing vertical surfaces of gate conductor 16. A lightly doped drain ("LDD") implant 22 is forwarded into substrate 10 prior to formation of spacers 20. After LDD 22 is present, and spacers 20 are produced, source/drain implants ("junctions") 24 are then formed. Prior to or after forming source/drain regions 24 is a processing step used to produce well-connect implant 26. Well-connect implant 26 is spaced from the area encompassed by first transistor 30. The amount of spacing is one such that implant 26 is electrically isolated from source/drain region 24 as well as LDD region 22. Thus, well-connect implant 26 is doped with an impurity opposite the impurity used in source/drain region 24 and LDD region 22. For example, well-connect implant 26 can comprise a p-type dopant, whereas the junction implants used to form n-channel transistor 30 can comprise n-type dopant. Conversely, well-connect implant 26 is n-type if transistor 30 is a p-channel transistor.

Formation of the source/drain region 24, LDD region 22, spacer 20, and well-connect implant 26 are processing steps which follow a particular sequence generally known to those skilled in the art. Regardless of the process sequence chosen, it is important to maintain adequate spacing between well-connect implant 26 and the outer periphery of source/drain region 24. The amount of spacing is dependent upon the implant species used and the range (depth) in which those species are forwarded into substrate 10. It is also important that the impurity type used to form well-connect implant 26 be of the same type found within substrate 10. As such, well-connect implant 26 forms a low resistance path to substrate 10. More specifically, well-connect implant 26 electrically couples to substrate 10 and specifically the channel region within substrate 10 directly beneath gate conductor 16 and gate dielectric 18.

Figure 3:
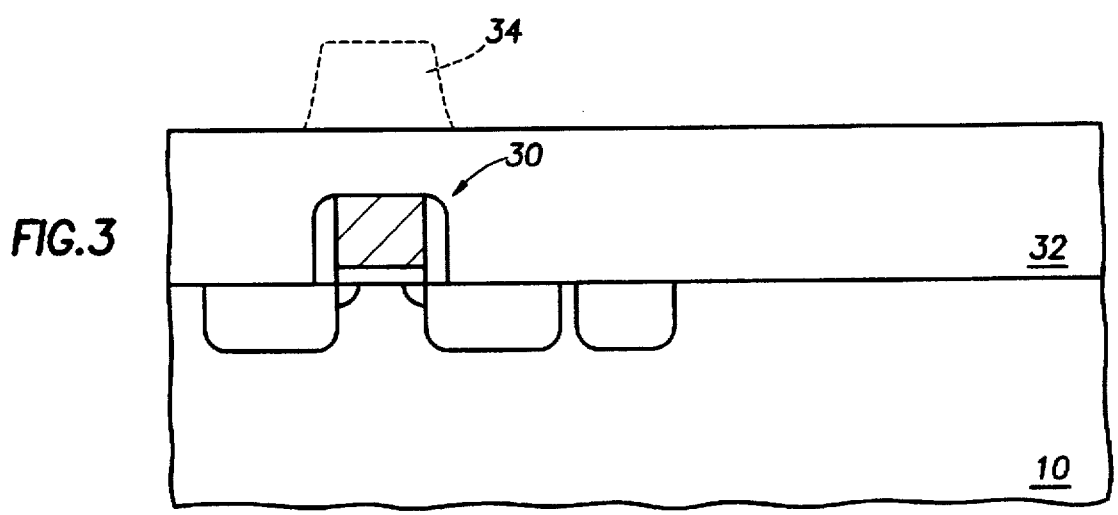
FIG. 3 is a partial cross-sectional view of the semiconductor substrate having a first dielectric layer deposited across the first transistor according to a processing step subsequent to FIG. 2.

FIG. 3, depicts a processing step subsequent to FIG. 2, wherein a first dielectric layer 32 is deposited across the transistor 30 as well as the topological surface of substrate 10 in regions outside of transistor 30. As first dielectric 32 is deposited, it conforms to some degree to the upward protruding gate conductor 16 of transistor 30 to form a peak 34. Peak 34 is preferably removed by a subsequent processing step using chemical mechanical polishing ("CMP"). CMP utilizes a slurry material and a polishing pad placed on the exposed surface of first dielectric 32, whereby the pad rotates and removes the upper surfaces commensurate with the lower surfaces. According to another technique, upper surface 34 can be removed using a sacrificial etch back. In this instance, a sacrificial material is placed on the upper surface such that the recesses or valleys are filled with that material. The material upper surface is then removed at an etch rate substantially the same as the dielectric under layer. When all of the sacrificial material is removed, the remaining dielectric surface is approximately planer in that it takes on the same contours as the planer surface of the sacrificial material. Regardless of the method chosen, the outcome remains the same: to produce a somewhat planer upper surface of first dielectric 32 in readiness for subsequent processing steps.

Figure 4:
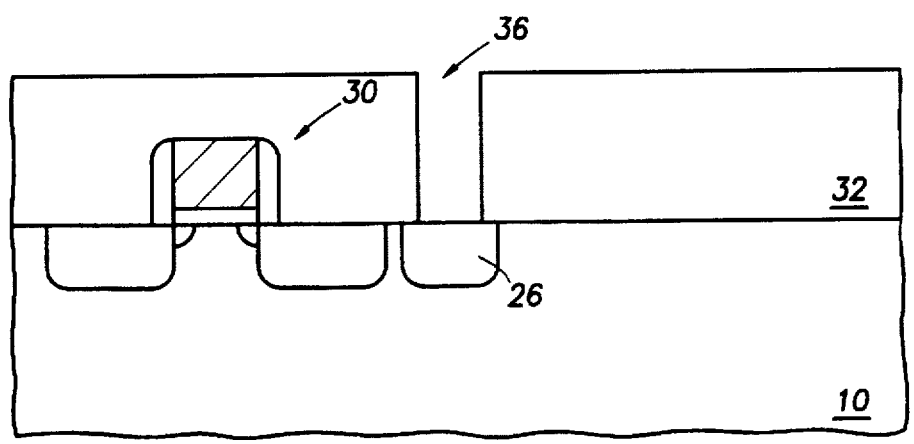
FIG. 4 is a partial cross-sectional view of the semiconductor substrate having an opening formed through the first dielectric to the well-connect implant according to a processing step subsequent to FIG. 3.

Referring to FIG. 4, an illustration is provided of an opening 36 formed through first dielectric 32 to well-connect implant 26. Opening 36 is produced by placing a masking layer across first dielectric 32 and then patterning a masking layer such that the region to be removed is exposed. The exposed region is then subjected to an etchant which, according to one embodiment, is a dry (anisotropic) etchant. Opening 36 is shown to extend along an axis perpendicular to the upper surface of first dielectric 32 and substrate 10 so as to form a direct path to well-connect implant 26. The width of opening 36 is defined to be no greater than the area occupied by well-connect implant 26.

Figure 5:
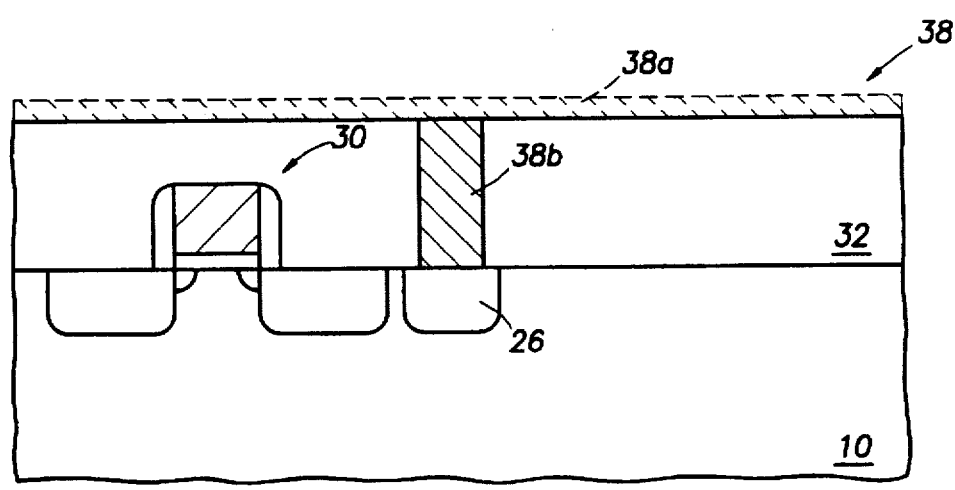
FIG. 5 is a partial cross-sectional view of the semiconductor substrate having a metal via formed within the confines of the opening according to a processing step subsequent to FIG. 4.

As shown in FIG. 5, opening 36 is filled with a conductive material 38. Preferably, conductive material 38 is a metal or metal alloy such as Ti, W, TiN or Al. Conductive material 38 is thereafter removed from the upper surfaces of first dielectric 32 but retained within the confines of opening 36. The removed portions of conductive material 38 are shown by reference numeral 38a and the retained portions of conductive material 38 are shown by reference numeral 38b. Accordingly, reference numeral 38b denotes a via. The upper surface of via 38a is commensurate with the upper surface of first dielectric 32 using, for example, CMP. Removal of portions 38a is necessary to retain the substantially planer upper surface created during formation of first dielectric 32.

Conductive material 38 can be deposited in various ways such as, for example, sputter deposition, evaporation, etc. Regardless of the deposition method chosen, material 38 fills opening 36 so that via 38b occurs.

Figure 6:
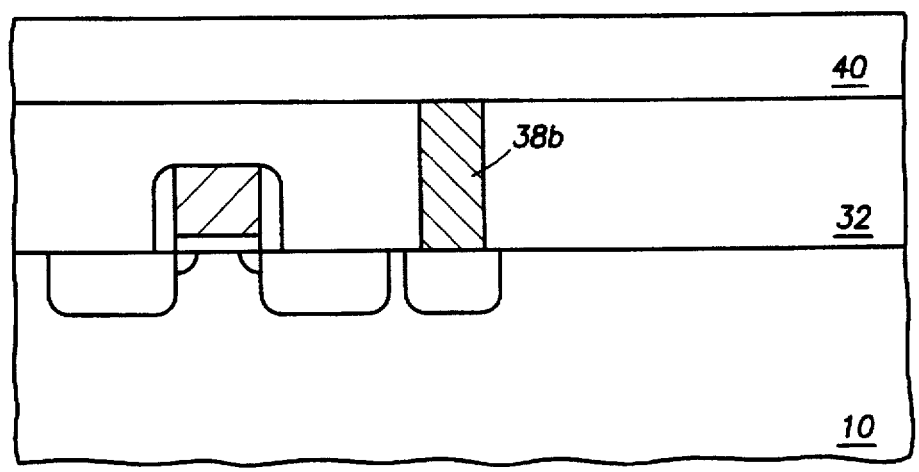
FIG. 6 is a partial cross-sectional view of the semiconductor substrate having a second dielectric deposited upon the first dielectric and metal via according to a processing step subsequent to FIG. 5.

FIG. 6 depicts the deposition of a second dielectric 40 upon first dielectric 32 as well as via 38b. Second dielectric 40 can, according to one embodiment, be made of the same material as that used to form first dielectric 32. According to one example, dielectric 40 is formed from chemical vapor deposition ("CVD"). The CVD process is performed such that an oxide or silicon dioxide is deposited to a thickness sufficient to define the thickness of an ensuing substrate in and upon which a second transistor is to be formed.

Figure 7:
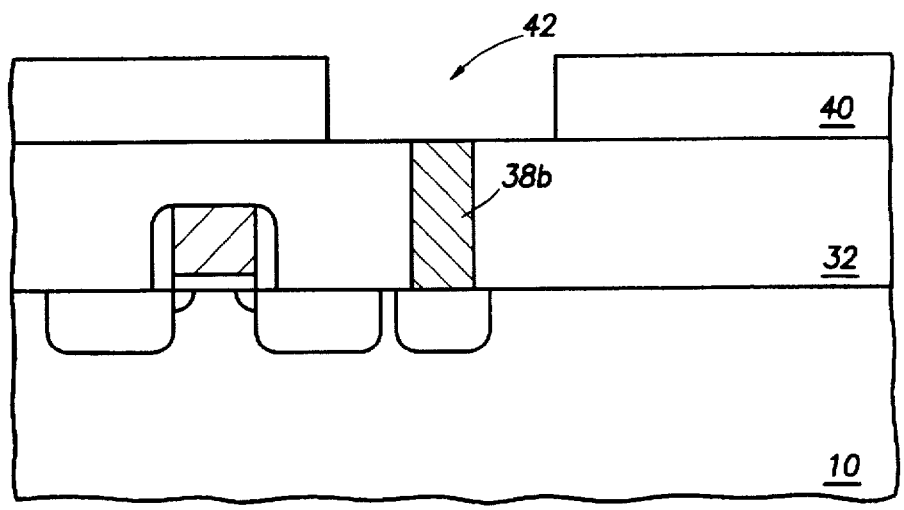
FIG. 7 is a partial cross-sectional view of the semiconductor substrate having the second dielectric removed in a region above and laterally from the metal via to form a trench according to a processing step subsequent to FIG. 6.

FIG. 7 illustrates a processing step subsequent to FIG. 6, wherein a trench 42 is formed substantially through second dielectric 40 in a region directly above via 38b as well as a region laterally spaced from via 38b. Trench 42 is produced by placing a masking layer across second dielectric 40 and then patterning the masking layer such that the region to be trenched is exposed. The exposed region is then subjected to an etchant which, according to one embodiment, is a dry (anisotropic) etchant. The etch is designed to continue for a time sufficient to remove second dielectric 40. That time can be measured by detecting metal byproduct from via 38b, for example.

Figure 8:
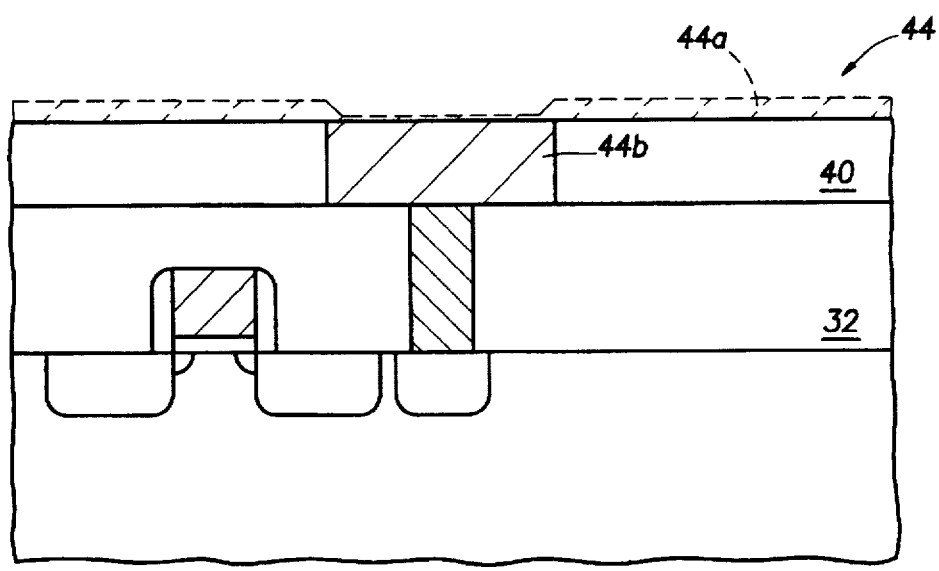
FIG. 8 is a partial cross-sectional view of the semiconductor substrate having a substrate formed within the trench according to a processing step subsequent to FIG. 7.

As shown in FIG. 8, trench 42 is filled with a polycrystalline ("polysilicon") material 44. Polysilicon 44 fills trench 42 by a blanket depositing a layer of polysilicon to a thickness which is greater than the depth of trench 42. Thereafter, the upper regions of polysilicon layer are removed using, for example, CMP. Removal continues for a time sufficient to retain polysilicon 44 only within the confines of trench 42. The removed portions of polysilicon 44 are denoted as reference numeral 44a, and the retained portions of polysilicon 44 are denoted as reference numeral 44b. The retained portion 44b is henceforth referred to as a substrate or well region upon which and into which a second transistor is formed.

Figure 9:
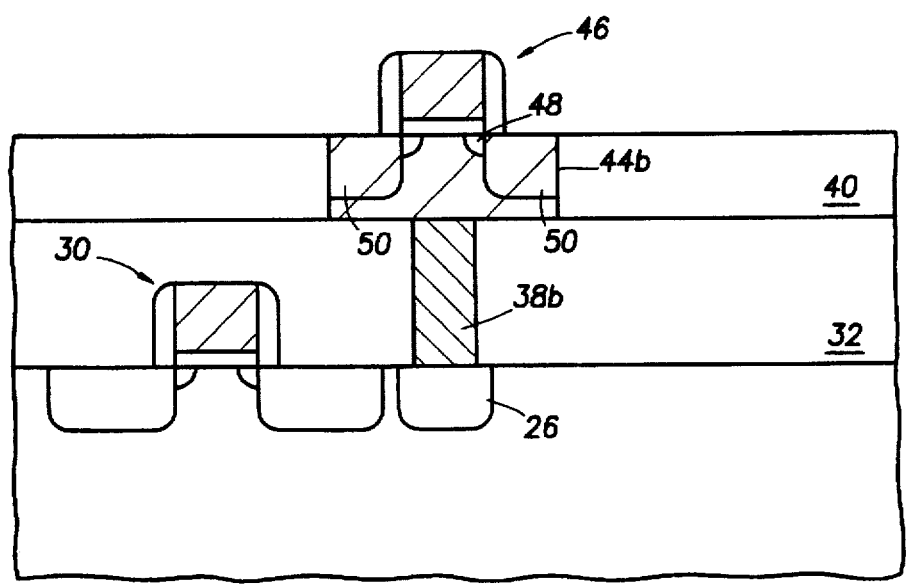
FIG. 9 is a partial cross-sectional view of the semiconductor substrate having a gate conductor formed upon the substrate and source/drain implants placed within the substrate to complete a second transistor according to a processing step subsequent to FIG. 8.

FIG. 9 illustrates formation of the second transistor, denoted as reference numeral 46. Second transistor 46 is produced by implanting LDD and source/drain regions 48 and 50 into substrate 44b. Implant of those regions occur by a self-align process, similar to that used to produce first transistor 30. As shown, substrate 44b is electrically connected to and abuts with via 38b. As such, electrical connection is made between substrate 44b and well-connect implant 26 by a virtue of via 38b.

The processing steps used to produce second transistor 46 need not be shown for sake of brevity. However, it is understood that those steps used to produce second transistor 46 are replicated from those used in producing first transistor 30. Regardless of the steps used, second transistor 46 comprises a well region existing between source and drain regions 50. The well region of second transistor 46 is electrically linked to via 38b. Since via 38b is conductive, and preferably metal, electrical connection is effectuated thereby to well-connect implant 26. Well-connect implant 26, being of the same impurity type as substrate 10, is electrically connected to the well of first transistor 30. Although it is of the same impurity type as substrate 10, well-connect implant 26 contains a greater concentration of impurities than substrate 10.

For sake of clarity, first transistor 30, second transistor 46, and the various features used therein are not drawn to scale. Likewise, the topological thickness of first dielectric 32 and second dielectric 40 are not drawn to scale. It is not imperative that these features be defined or that dimensions be specified, all of which would be readily apparent to those skilled in the art given the benefits described herein. All that is necessary, however, is that second transistor 46 be confined entirely upon and within substrate 44b, and that substrate 44b be electrically connected to substrate 10. Of importance to that connection is that the relatively short distance by which the vertically directed via 38b extends. This short distance, and the highly conductive nature of the metal material used in forming the via, helps to prevent a substantial voltage differential between the channel regions of transistors 30 and 46. Thus, the present process is designed to enhance consistency and conformity in the operation of transistors placed on separate elevation levels.

It will be appreciated to those skilled in the art having the benefit of this disclosure that the present process methodology is capable of producing p-type and/or n-type devices in three dimensions. According to one embodiment, transistors 46 and 30 are n-type transistors, and the channel areas of those respective transistors are p-type. Alternatively, transistors 46 and 30 can be p-type transistors, with the well areas doped n-type. In the former instance, the well-connect implant 26 is doped p-type, and in the latter instance well-connect implant 26 is doped n-type. The relative concentrations of those dopants would be generally known to those skilled in the art.

It is be understood that the form of the invention shown and described is to be taken as exemplary, presently preferred embodiments. For sake of brevity, only one transistor is shown on each elevation level. However, it is within the spirit and scope of the present invention that numerous transistors be arranged across each elevation level so that the overall circuit extends in three dimensions and that select transistors on one elevation level can be connected to select transistors on another elevation level by a virtue of a well-connect via, such as via 38b. Various modifications and changes may be made to each and every processing step without departing from the spirit and scope of the invention provided the well-connect via concepts set forth in the present claims are retained. It is intended that the following claims therefore be interpreted to embrace all such modifications and changes, and accordingly, the specification and drawings are to be regarded in an illustrative rather than a restrictive sense.

What is claimed is:

1. A method for interconnecting a substrate of a first transistor to a substrate of a second transistor, comprising:

providing a first substrate encompassing a well-connect implant, a source region and a drain region, wherein said source and drain regions are spaced about a channel region of a first transistor;

depositing a first layer of dielectric across said first transistor;

etching an opening through said first dielectric to said well-connect implant;

filling said opening with a metal;

depositing a second layer of dielectric upon said first layer of dielectric and said metal;

removing said second layer of dielectric in a region above said metal to form a trench and thereafter filling said trench with a second substrate such that a bottom surface of said second substrate contacts said metal; and implanting dopants within said second substrate to render the second substrate conductive and thereafter depositing films and dopants upon and within, respectively, said second substrate to form a second transistor.

2. The method as recited in claim 1, wherein said source region, said drain region and said well-connect implant are spaced from each other.

3. The method as recited in claim 1, wherein said providing comprises forwarding a first dopant into said first substrate to form said source and drain regions, and forwarding a second dopant into said first substrate to form said well-connect implant.

4. The method as recited in claim 3, wherein said first dopant is opposite said second dopant.

5. The method as recited in claim 1, wherein said first layer of dielectric comprises oxide.

6. The method as recited in claim 1, wherein the region removed of said second dielectric layer is laterally bounded a spaced distance from said metal.

7. The method as recited in claim 1, wherein said filling the trench comprises:

depositing polysilicon within said trench to a thickness which exceeds the depth of said trench; and removing said second substrate to an elevation commensurate with an upper surface of said second dielectric.

8. The method as recited in claim 1, wherein said metal is selected from the group consisting of Ti, W, TiN and Al.

9. The method as recited in claim 1, wherein said first and second transistors are vertically spaced from one another on separate elevational levels.

10. A method for interconnecting a pair of transistors, comprising:

forming a first transistor upon and within a first topography, and a well-connect implant spaced from the first transistor within a first topography;

depositing, across said first transistor and said well-connect implant, a first dielectric having a substantially planar first dielectric surface;

etching an opening through said first dielectric from said first dielectric surface to said well-connect implant;

filling said opening with a metal;

depositing a second layer of dielectric upon said first layer of dielectric and said metal;

removing said second layer of dielectric in a region above and laterally spaced from said metal to form a trench;

filling said trench with a polysilicon material such that said polysilicon material abuts said metal; and forming a source region and a drain region spaced apart from each other by a channel region to form a second transistor, wherein the channel region resides directly above said metal.

11. The method as recited in claim 10, further comprising implanting said polysilicon material with a dopant of the same type as the well-connect implant.

12. The method as recited in claim 10, wherein said forming comprises implanting said source and drain regions with an implant type opposite that of said well-connect implant.

13. The method as recited in claim 10, wherein said removing and said filling comprising forming a metal via which extends along an axis perpendicular to said first dielectric surface.

14. The method as recited in claim 13, wherein said metal via comprises an upper portion and a lower portion opposite the upper portion, said upper portion abuts against said polysilicon and said lower portion abuts against said well-connect implant.

15. The method as recited in claim 10, wherein said first and second dielectrics each comprises oxide.

16. The method as recited in claim 10, wherein said removing the second layer of dielectric continues for a time sufficient to remove said second layer of dielectric commensurate with an upper surface of said metal and said first layer of dielectric.

17. The method as recited in claim 10, wherein said filling the trench comprises:

depositing polysilicon within said trench to a thickness which exceeds the depth of said trench; and removing said polysilicon to an elevation commensurate with an upper surface of said second dielectric.

18. The method as recited in claim 10, wherein said metal is selected from the group consisting of Ti, W, TiN and Al.

19. The method as recited in claim 10, wherein said first and second transistors are vertically spaced from one another on separate elevational levels.

* * * * *